(12) United States Patent
Kushino

(10) Patent No.: US 6,538,303 B1
(45) Date of Patent: Mar. 25, 2003

(54) LEAD FRAME AND SEMICONDUCTOR DEVICE USING THE SAME

(75) Inventor: Masahiko Kushino, Yamatotakada (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 09/516,157

(22) Filed: Feb. 29, 2000

(30) Foreign Application Priority Data

Jun. 2, 1999 (JP) .......................................... 11-155665

(51) Int. Cl.[7] .............................................. H01L 23/495
(52) U.S. Cl. ....................................... 257/666; 257/667
(58) Field of Search ................................ 257/666, 667, 257/675, 676, 711

(56) References Cited

U.S. PATENT DOCUMENTS

| | | | | |
|---|---|---|---|---|
| 5,814,877 A | * | 9/1998 | Diffenderfer et al. ........ | 257/666 |
| 5,885,853 A | * | 3/1999 | Hamburgen ................ | 438/122 |
| 5,905,299 A | * | 5/1999 | Lacap ........................ | 257/666 |
| 5,982,028 A | * | 11/1999 | Pape et al. .................. | 257/676 |
| RE36,613 E | * | 3/2000 | Ball ............................ | 257/676 |
| 6,255,742 B1 | * | 7/2001 | Inaba ........................ | 257/666 |

FOREIGN PATENT DOCUMENTS

| | | |
|---|---|---|
| JP | 04-199668 | 7/1992 |
| JP | 08-083876 | 3/1996 |

OTHER PUBLICATIONS

Japanese Kokai (Published unexamined patent application) No. 130782/1995 (Tokukaihei 7-130782, Published Date: May 19, 1995).*

* cited by examiner

Primary Examiner—Stephen D. Meier
Assistant Examiner—Kusha Rose
(74) Attorney, Agent, or Firm—Nixon & Vanderhye PC (57) ABSTRACT

In a semiconductor device, an island penetrating hole, which is larger than a mounted chip, is formed on an island of a lead frame, and a heatsink is mounted on the island so as to cover the island penetrating hole. The chip is disposed on a surface of the heatsink in the island penetrating hole. The ground terminal of the chip and the island are wire-bonded to each other via GND wires. This arrangement makes it possible to reduce a heat resistance in a heat-releasing path, thereby improving a heat-releasing property. Further, the GND wires are shortened and a GND inductance is reduced. Consequently, it is possible to efficiently exert capability of the chip.

21 Claims, 11 Drawing Sheets

LEAD FRAME AND SEMICONDUCTOR DEVICE USING THE SAME

FIELD OF THE INVENTION

The present invention relates to a lead frame used for a package including a heatsink, that is used for a device such as a mold-type high-frequency power device, and a semiconductor device using the lead frame.

BACKGROUND OF THE INVENTION

A conventional semiconductor device being provided with a package including a heatsink is disclosed in, for example, in Japanese Published Unexamined Patent Application No. 130782/1995 (Tokukaihei 7-130782, published on May 19, 1995). Referring to FIGS. 6(a) through 9(b), the following explanation describes the construction thereof.

Figure 6A:
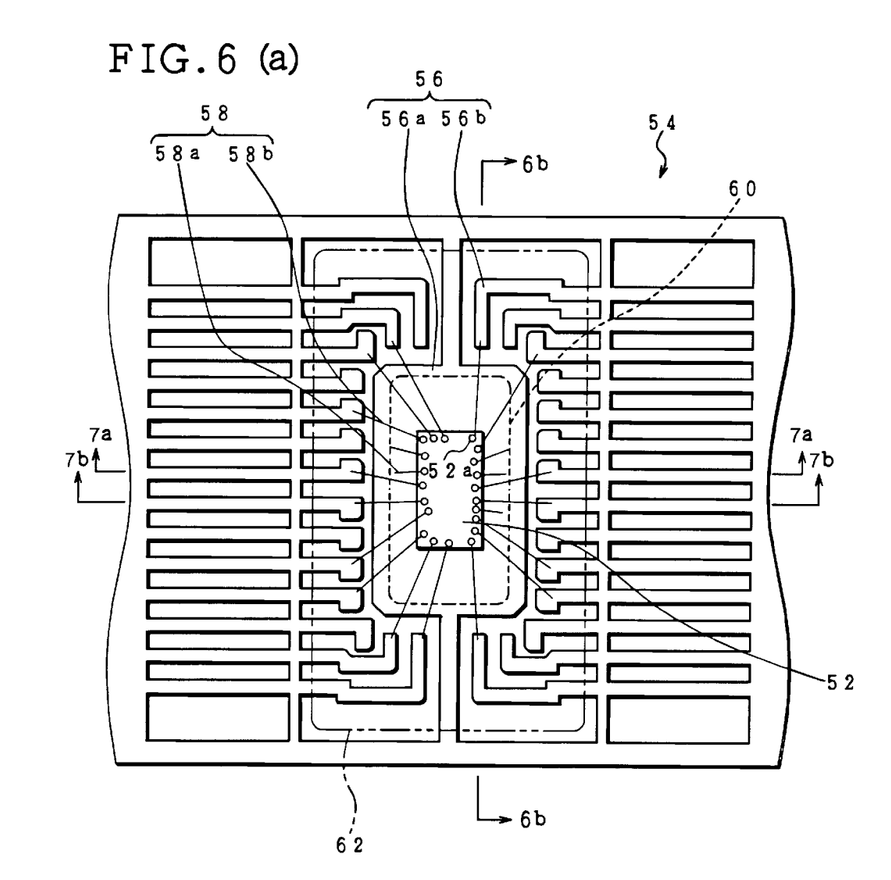
FIG. 6(a) is a plan view showing a forming process of a conventional semiconductor device.
Figure 6B:
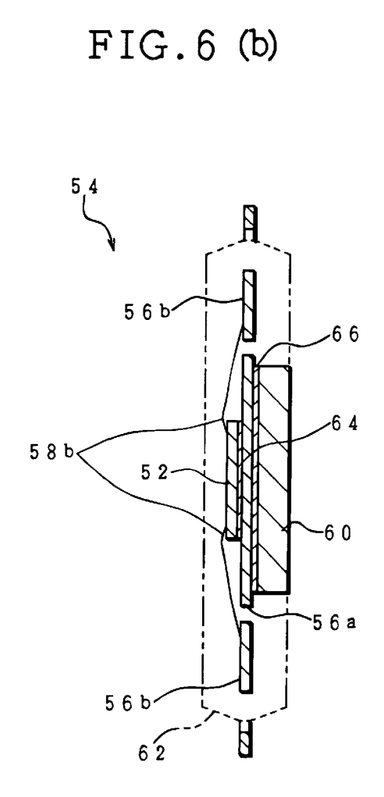
FIG. 6(b) is a sectional view taken along line 6b—6b shown in FIG. 6(a).
Figure 7:
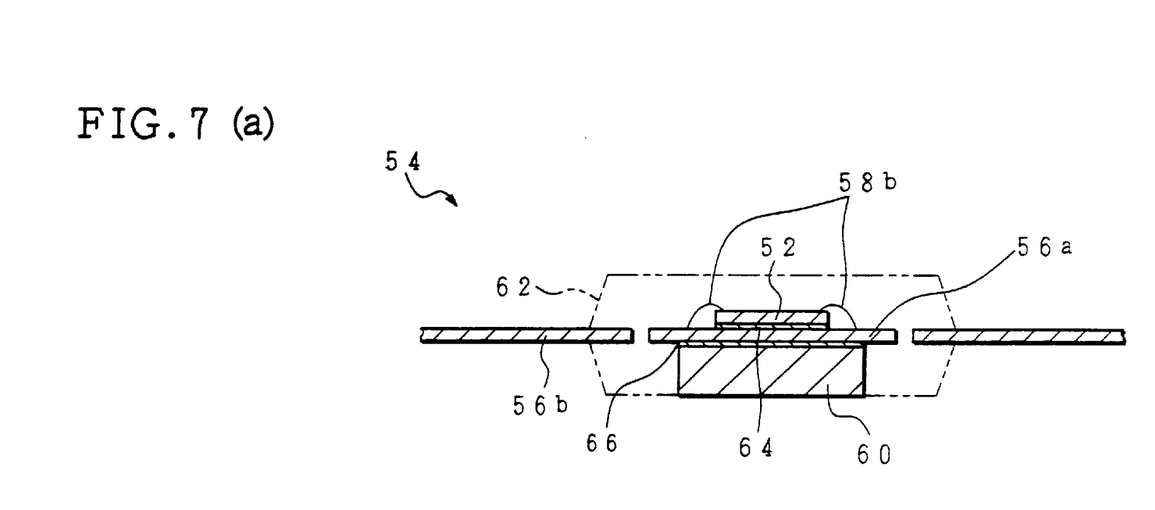
FIG. 7(a) is a sectional view taken along line 7a—7a shown in FIG. 6(a).
FIG. 7(b) is a sectional view taken along line 7b—7b shown in FIG. 6(a).

FIG. 6(a) is a plan view showing a conventional semiconductor device in a forming process. FIG. 6(b) is a sectional view taken along line 6b—6b shown in FIG. 6(a). Further, FIG. 7(a) is a sectional view taken along line 7a—7a shown in FIG. 6(a). FIG. 7(b) is a sectional view taken along line 7b—7b shown in FIG. 6(a). The semiconductor device (conventional example 1) is formed by a chip 52 and a package 54 including the chip 52.

The package 54 is constituted by a lead frame 56, bonding wires 58, a heatsink 60, and a sealing member 62. The lead frame 56 is constituted by a die pad 56a and leads 56b and is provided with a chip 52 which is die-bonded via an Ag paste 64 on the die pad 56a. As the chip 52, for example, a GaAsMMIC (Monolithic Microwave Integrated Circuit) chip can be adopted.

The bonding wires 58 is formed by an Au wire and has two kinds of wires of GND wires 58a and lead wires 58b for connecting chip pads 52a, which are formed on the chip 52, and the die pad 56a or the leads 56b, which are formed on the lead frame 56. A GND wiring on a circuit of the chip 52 is formed by the GND wires 58a, and a GND inductance occurs during an operation.

A heatsink 60 is a copper block that is entirely bonded to a back of a surface of the die pad 56a via a conductive paste 66, the surface having the chip 52 disposed thereon. Further, a surface of the heatsink 60, that is entirely bonded to the die pad 56a, has a back surface exposed from a sealing member 62. When the present semiconductor device is packaged, the exposed surface is soldered onto a packaged surface. With this arrangement, it is easier to release heat occurring during an operation of the chip 52, through the heatsink 60 to the outside of a semiconductor package.

The semiconductor device is formed in the following manufacturing process. Firstly, the copper heatsink 60 of 2.0×2.8×0.7 mm, that is separately formed, is entirely bonded via the conductive paste 66 on the back of the copper lead frame 56 having a thickness of 0.15 mm. The Ag paste 64 is applied onto the die pad 56a of the lead frame 56, and the chip 52 is die-bonded.

Afterwards, by the bonding wires 58, the chip pads 52a of the chip 52 are wire-bonded to the die pad 56a or the leads 56b of the lead frame 56. And then, the semiconductor device is transfer molded by the sealing member 62.

Figure 8:
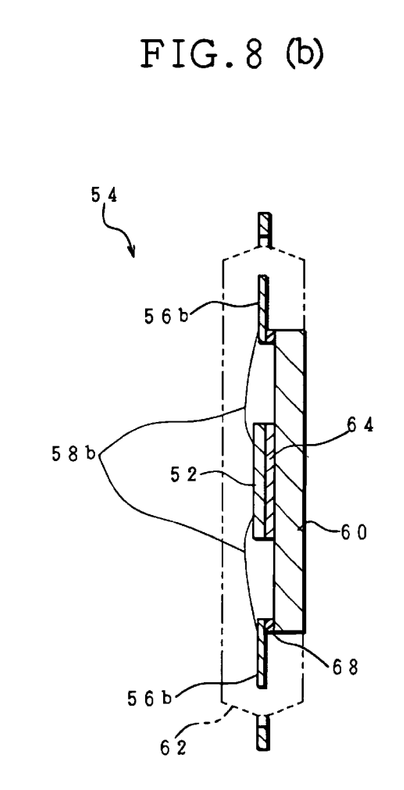
FIG. 8(a) is a plan view showing a forming process of another conventional semiconductor device.
FIG. 8(b) is a sectional view taken along line 8b—8b shown in FIG. 8(a).
Figure 9:
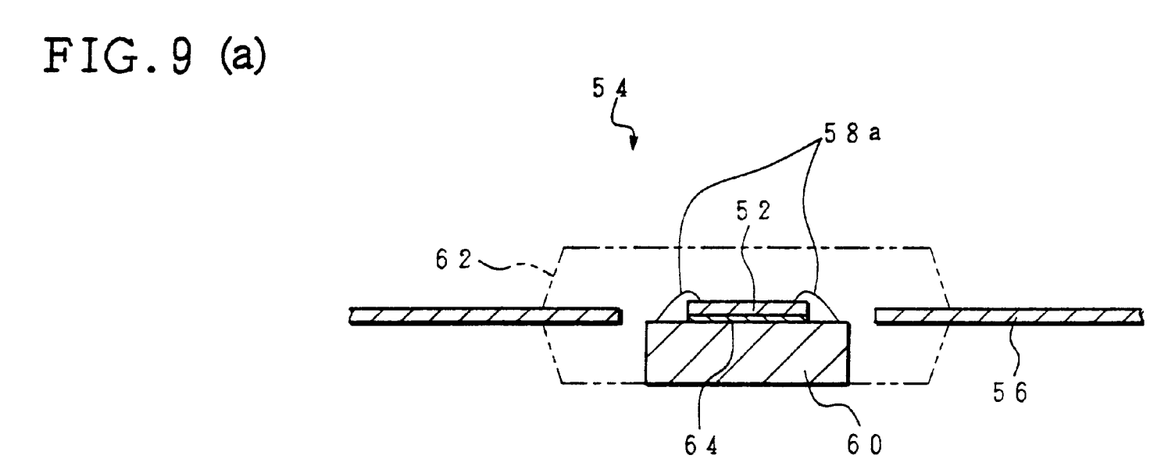
FIG. 9(a) is a sectional drawing taken along line 9a—9a shown in FIG. 8(a).
FIG. 9(b) is a sectional drawing taken along line 9b—9b shown in FIG. 8(a).

Next, FIGS. 8(a) through 9(b) show a conventional semiconductor device (conventional example 2) being provided with another conventional package including a heatsink. FIG. 8(a) is a plan view showing the semiconductor device of the conventional example 2 in a forming process. FIG. 8(b) is a sectional view taken along line 8b—8b shown in FIG. 8(a). And FIG. 9(a) is a sectional view taken along line 9a—9a shown in FIG. 8(a). FIG. 9(b) is a sectional view taken along line 9b—9b shown in FIG. 8(a). Here, those members that have the same functions and that are described in conventional example 1 are indicated by the same reference numerals and the description thereof is omitted.

Here, conventional example 2 is different from conventional example 1 as follows: in conventional example 2, a lead frame 56 of a semiconductor device does not include a die pad 56a (see FIG. 6(a)), and a heatsink 60 also serves as a die pad. Further, in the lead frame 56, lower surfaces of all leads 56b are mounted on the upper surface of the heatsink 60 via an insulating paste 68. Moreover, GND wires 58a are bonded onto the upper surface of the heatsink 60 and form a GND wiring on a circuit of a chip 52, so that a GND inductance occurs during an operation.

The semiconductor device of conventional example 2 is formed in the following manufacturing process. Firstly, a Ag paste 64 is applied to the center of the surface of the heatsink 60 that has the chip 52 mounted thereon, and the chip 52 is die-bonded. And then, the heatsink 60 and the lead frame 56 are disposed with the insulating paste 68. Afterwards, the chip pads 52a are wire-bonded to the leads 56b or the upper surface of the heatsink 60 also serving as the die pad 56a. And then, the semiconductor device is completed after performing the same process as conventional example 1.

Incidentally, when the semiconductor device, particularly a high-frequency power device is packaged into a resin mold, a heat-releasing property and a high-frequency property are important. Namely, in view of releasing heat, the chip 52 has a large amount of self-heating, so that it is necessary to reduce and simplify (reduce heat resistance) a heating path and to release generated heat efficiently to the outside so as to restrict a higher temperature in the chip 52. Moreover, in view of the high-frequency property, a GND inductance needs to be minimized.

However, a package 54 used for a semiconductor device of the conventional art has the following problem regarding a heat-releasing path and a GND inductance.

Firstly, in conventional example 1, on the heat-releasing path, many members are disposed between the chip 52 serving as a heat-releasing part and the outside of the semiconductor device. The heat-releasing path has an extremely large heat resistance of, for example, 50° C./W.

Figure 10:
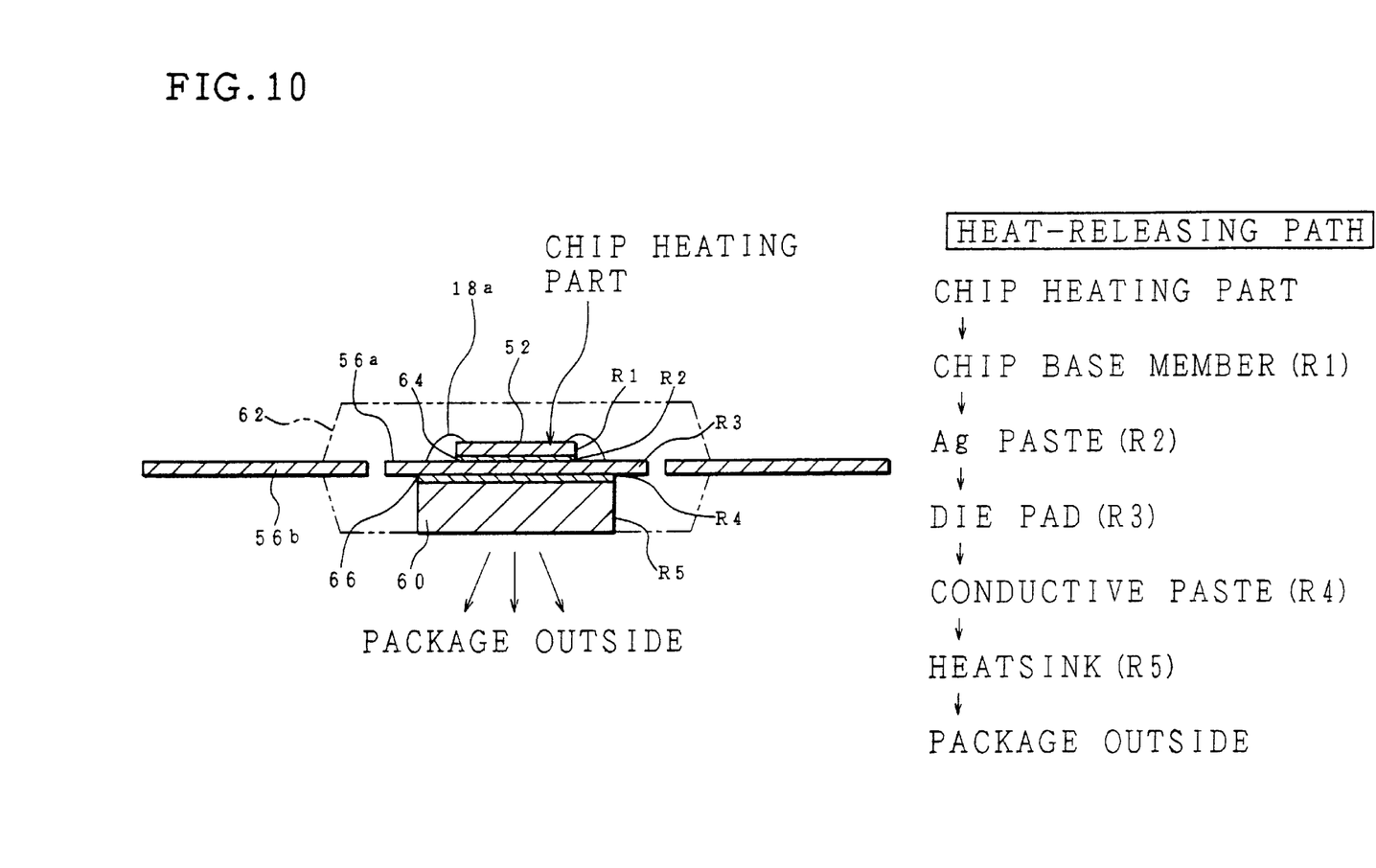
FIG. 10 is a conceptual drawing showing a heat-releasing path of the conventional semiconductor device as a comparative example.

FIG. 10 shows the heat-releasing path under such a condition for each heat resistance (simple resistance). FIG. 10 is a conceptual drawing showing the heat-releasing path of conventional example 1. To be specific, the heat-releasing path is: a heat-releasing part of the chip 52→a base member of the chip 52 (R1)→the Ag paste 64 (R2)→die pad 56a (R3)→a conductive paste 66 (R4)→the heatsink 60 (R5) →the outside of the package 54. This can be cumulatively expressed as follows: package heat resistance: Rth=R1+R2+R3+R4+R5.

As described above, conventional example 1 has a long and complicated heat-releasing path, so that the package heat resistance is high. Thus, when the semiconductor device of conventional example 1 is continuously operated, the temperature may rise too much inside the package 54. When the temperature is too high in the package 54, the following phenomenon appears so as to cause a problem. Firstly, an output power value serving as an electrical property is reduced with time. Further, even when an input power is increased to obtain a desired output power, the output power value is at saturation due to a high temperature of the inside, so that the output power value cannot be raised any more.

In order to solve the problem, it is necessary to shorten and simplify the heat-releasing path to a minimum, to reduce heat resistance of the package 54, and to improve a heat-releasing property so as to prevent an increase in temperature inside the package 54. Hence, conventional example 2 achieves a construction which does not include the die pad 56a so as to realize a heat-releasing path in which R3 and R4 are omitted.

Here, in conventional example 2, the lead frame 56 and the heatsink 60 are mounted on the leads 56b of the lead frame 56. The leads 56b are separated later to form terminals of the semiconductor device, so that the leads 56b need to be electrically insulated. Therefore, a part for mounting the lead frame 56 and the heatsink 60 is generally mounted via the insulating paste 68, an insulating tape, an insulating adhesive, and others. However, this arrangement causes the following problem.

In conventional example 2, the lead frame 56 and the heatsink 60 are firstly disposed, and then, the chip 52, the heatsink 60, and the lead frame 56 are wire-bonded via the bonding wires 58. The heatsink is heated at this time so as to generate gas of organic components from the insulating paste 68 and others.

The generation of gas deteriorates the surfaces of the lead frame 56 and the heatsink 60 so as to increase a possibility of causing a connecting defect of the wire bonding. Thus, the reliability of the wire bonding is reduced and a fraction defective is increased. Further, the heat sink 60 is heated so as to reduce the adhesion of the insulating paste 68 and others, so that the heatsink 60 becomes detached from the lead frame 56.

Furthermore, in conventional example 2, it is necessary to apply the insulating paste 68 and others merely on the surfaces of a large number of the leads 56b disposed in the lead frame 56, the surfaces being connected to the heatsink 60. Thus, the manufacturing cost is further raised due to an increase in the fraction defective as well.

Additionally, there has been a problem of a GND inductance, that appears in the above conventional arts.

In a frequency area of 1 GHz or more, which is applicable to a high-frequency power device, grounding is made by the GND wires 58a, so that a GND inductance occurs.

In view of a circuit of the chip 52, the grounding (GND) on the circuit is raised from an original grounding by the appearing GND inductance. Therefore, the output value of the conductive device is reduced from an originally set output value by a value corresponding to the GND inductance, so that a predetermined output value cannot be obtained.

Therefore, it is necessary to reduce a GND inductance to solve the above problem. In this case, the number of the GND inductance wires 58a can be increased to reduce a GND inductance. However, another problem occurs as follows.

It is necessary to increase the chip pads 52a to dispose a larger number of the GND wires 58a, causing a larger size of the chip. Here, in the case of a chip such as a GaAsMMIC chip serving as the chip 52, a GaAsMMIC wafer serving as a base member is more expensive than Si, so that the cost of the chip 52 is almost determined by the number of the chips 52 mounted on a wafer. Consequently, a larger chip increases the cost of the semiconductor device.

Further, when the pitches of the GND wires 58a are reduced to increase the number of the GND wires 58a, a GND inductance cannot be effectively reduced in a frequency area of 1 GHz or more due to influence of mutual inductance.

As described above, with the conventional lead frame and the semiconductor device using the same, it is difficult to improve a heat-releasing property and a high frequency property without deterioration in reliability and productivity and without increasing the cost accordingly. Hence, the capability of the semiconductor chip cannot be fully exerted.

SUMMARY OF THE INVENTION

The present invention is devised to solve the above-mentioned problems. The objective is to provide a lead frame for a semiconductor device that can reduce a heat resistance and improve a heat-releasing property without deterioration in reliability and productivity and accordingly without an increase in cost. Further, the objective is to provide a lead frame for a semiconductor device that can reduce a GND inductance and improve a high-frequency property so as to efficiently exert the capability of a mounted semiconductor chip. Furthermore, the objective is to provide a semiconductor device using such a lead frame used for a semiconductor device.

The lead frame of the present invention is a lead frame used for a semiconductor device. In order to achieve the above objective, the lead frame is provided with an island for mounting a semiconductor chip, a metallic block disposed on the island, and leads extended to the island. In the island, a penetrating hole being larger than the mounted semiconductor chip is formed in an area, in which the semiconductor chip is mounted, and the metallic block is disposed so as to cover the penetrating hole.

According to the above arrangement, the penetrating hole formed in the island of the lead frame is larger than the mounted semiconductor chip, so that the semiconductor chip can be disposed in the penetrating hole. Moreover, the metallic block covers the penetrating hole, so that the semiconductor chip can be disposed on a surface of the metallic block in the penetrating hole, and the metallic block can be used as a heatsink.

Therefore, unlike the conventional art, it is possible to form a heat-releasing path without the necessity for the island disposed between the heatsink and the semiconductor chip serving as a heating part, thereby improving a heat-releasing property.

Moreover, unlike a construction in which the heatsink is mounted on the leads, in the above arrangement, the metallic block serving as the heatsink is disposed on the island of the lead frame. Therefore, it is possible to form a construction in which the leads and the metallic block are insulated from one another without using an insulating paste for mounting the metallic block. Namely, a method can be adopted in which the metallic block is electrically brought into conduction with the island.

Hence, it is possible to prevent a problem such as reduction in adhesion of the heatsink, reduction in reliability of wire-bonding, and more complicated process, that are caused by the insulating paste, which is normally used for a construction in which the heatsink is mounted on the leads.

It is further desirable that the island and the metallic block be formed so as to be separated from the leads in the lead frame.

According to this arrangement, the island and the metallic block are formed so as to be separated from the leads, for example, upon forming the semiconductor device. The island and the metallic block can be electrically insulated from the leads. Therefore, the island can act as a GND on a circuit of the semiconductor chip. When the island acts as the GND, ground terminals of the semiconductor chip can be wire-bonded to the island.

Here, in this arrangement, the semiconductor chip and the island can be disposed on a surface of the metallic block. Thus, as compared with a construction in which the ground terminals are wire-bonded to a surface having the semiconductor chip disposed thereon, it is possible to reduce a height difference between the wire-bonded surfaces. With this arrangement, it is possible to shorten bonding wires so as to reduce a GND inductance on the circuit. As a result, the lead frame having the above construction can improve a high-frequency property.

In order to achieve the above objective, the semiconductor device of the present invention is provided with the lead frame, and the semiconductor chip which is mounted on the metallic block in the penetrating hole formed in the lead frame.

According to the above construction, the metallic block acts as the heatsink, and the semiconductor chip is directly disposed on the heatsink. With this arrangement, it is possible to reduce a heat resistance and to simplify the heat-releasing path, so that heat generated in the semiconductor chip can be released more efficiently.

Consequently, even in the case of a continuous operation of the semiconductor device, it is possible to prevent an increase in temperature of the semiconductor chip therein and reduction in an electrical property such as an output voltage value.

In order to achieve the above objective, the semiconductor device of the present invention is provided with the lead frame, in which the island and the metallic block are formed so as to be separated from the leads, and the semiconductor chip having the ground terminals mounted on the metallic block in the penetrating hole, The ground terminals of the semiconductor chip are connected to the GND wires connected to the island.

According to this arrangement, the semiconductor chip is directly disposed on the metallic block, and the ground terminals of the semiconductor chip are connected to the island of the lead frame via the GND wires. Thus, as compared with a construction in which a surface having the semiconductor chip disposed thereon is connected to the ground terminals, it is possible to reduce a height difference between the connected surfaces because of a thickness of the island. With this arrangement, the GND wires (bonding wires) can be shortened.

Therefore, it is possible to reduce a GND inductance on the circuit of the semiconductor chip as well as to reduce a heat resistance so as to improve a heat-releasing property. As a result, in the present semiconductor device, it is possible to prevent reduction in an output value that is caused by a GND inductance.

In order to achieve the above objective, the semiconductor device of the present invention includes the semiconductor chip having the ground terminals that are mounted on a surface of the heatsink, and a metallic member disposed on the surface of the heatsink that has the semiconductor chip mounted thereon, the ground terminals and the metallic member being wire-bonded to one another.

In the above arrangement, the semiconductor chip is directly disposed on the heatsink, and the ground terminals of the semiconductor chip are connected to the metallic member disposed on the heatsink.

With this arrangement, it is possible to efficiently release heat generated in an operation of the semiconductor chip, via the heatsink to the outside of the semiconductor device. Consequently, it is possible to prevent an increase in temperature of the semiconductor device so as to prevent reduction in an output value, saturation, and other problems that are caused by a higher temperature.

Moreover, the metallic member is disposed on the surface of the heatsink that has the semiconductor chip mounted thereon, so that a height difference can be reduced between an upper surface of the metallic member and the surface of the semiconductor chip that has the ground terminals disposed thereon. This arrangement makes it possible to shorten the bonding wires for grounding of the semiconductor chip. Therefore, it is possible to reduce a GND inductance on the circuit of the semiconductor chip so as to prevent reduction in an output value that is caused by the GND inductance.

For a fuller understanding of the nature and advantages of the invention, reference should be made to the ensuing detailed description taken in conjunction with the accompanying drawings.

DESCRIPTION OF THE EMBODIMENTS

Referring to FIGS. 1(a) through 4, the following explanation describes one embodiment of the present invention.

FIG. 1(a) is a plan view showing a semiconductor device of the present embodiment in a forming process. FIG. 1(b) is a sectional view taken along line 1b—1b shown in FIG. 1(a). Further, FIG. 2(a) is a sectional view taken along line 2a—2a shown in FIG. 1(a). FIG. 2(b) is a sectional view taken along line 2b—2b shown in FIG. 1(a). The semiconductor device is constituted by a chip (semiconductor chip) 12 and a package 14 including the chip 12.

As the chip 12, for example, it is possible to adopt a chip such as a GaAsMMIC chip serving as a high-frequency power device. Here, a GaAsMMIC chip with a thickness of 0.2 mm is adopted.

The package 14 is constituted by a lead frame 16, bonding wires 18, a heatsink (metallic block) 20, and a sealing member 22. The lead frame 16 is formed by, for example, a Cu plate having a thickness of 0.15 mm and has an island (metallic member) 16a, leads 16b and hanger pins (supporting part) 16d.

Here, an island penetrating hole (penetrating hole) 16c is formed in the island 16a. The island penetrating hole 16c is a penetrating hole being slightly larger than the chip 12 mounted therein.

The leads 16b serve as terminals upon forming the semiconductor device. Each of the leads 16b is separated in the following step as described later. Further, the hanger pins 16d provides support to prevent separation of the island 16a in the lead frame 16 before and upon forming the semiconductor device. The hanger pins 16d are separated from the leads 16b in the following step.

The heatsink 20 is disposed on the island 16a so as to cover partially or entirely the island penetrating hole 16c. For example, a copper block of length (l) 2.0 mm×width (w) 2.8 mm×thickness (t) 0.7 mm can be adopted.

Here, the chip 12, the lead frame 16, and the heatsink 20 are arranged as follows: the lead frame 16 and the heatsink 20 are, for example, fixed by spot welding at spot welding positions 20a (two places between the island penetrating hole 16c and the hanging pins 16d of the lead frame 16). In addition to the spot welding, the lead frame 16 and the heatsink 20 can be fixed by any other method if the method can secure conductivity between them by fixing. For example, it is possible to adopt a method using a conductive paste and a metallically preformed eutectic.

Moreover, the chip 12 is mounted into the island penetrating hole 16c and is die-bonded via an Ag paste 24 to the upper surface (mounting surface) of the heatsink 20 in the island penetrating hole 16c. A material other than the Ag paste 24 can be adopted for the die-bonding. It is desirable that the material be superior in its conductivity and thermal conductivity.

The bonding wires 18 is formed by an Au wire and is constituted by two kinds of wires of GND wires 18a and lead wires 18b, that respectively connect the island 16a or the leads 16b to chip pads 12a formed in the chip 12. The GND wires 18a form a GND wiring on the circuit of the chip 12. Additionally, some of the chip pads 12a are grounded via the GND wires 18a and serve as ground terminals of the chip 12.

Here, the chip 12 is mounted into the island penetrating hole 16c, so that a height difference is reduced by a thickness of the island 16a (the specific figure is 0.15 mm) between the upper surface of the island 16a and the surface of the chip 12, that has the chip pads 12a formed thereon, the chip pads 12a being bonded via the GND wires 18a. Namely, the length of the GND wires 18a can be reduced.

The sealing member 22 is formed so as to include the chip 12, the bonding wires 18, the island 16a, parts of the leads 16b that are bonded to the lead wires 18b, the heatsink (especially, a surface on which the chip 12 is die-bonded) 20, and others. Here, it is desirable to expose the back of a surface of the heatsink 20 from the sealing member 22, the surface having the chip 12 die-bonded thereon. In this case, upon packaging the semiconductor device, the exposed part of the heatsink 20 can be, for example, soldered onto a mounting surface of the device. Thus, it becomes easier to release heat, which is generated during an operation of the chip 12, to the outside via the heatsink 60.

As described above, the lead frame 16 has a construction in which the heatsink 20 is disposed in the island 16a so as to cover the island penetrating hole 16c, which is formed in the island 16a so as to be larger than the chip 12 to be mounted. Further, the semiconductor device constituted by using the lead frame 16 has a construction in which the chip 12 is mounted into the island penetrating hole 16c and is directly die-bonded to a surface of the heatsink 20. The ground terminals of the chip 12 are wire-bonded to the island 16a.

Moreover, unlike conventional example 2 (see FIG. 8(a)) in which the leads 56b overlap the heatsink 60, in the present embodiment, a gap is disposed between (a) the leads 16b and (b) the heatsink 20 and the island 16a.

The following explanation describes an assembling process of the semiconductor device having the above arrangement.

Firstly, the lead frame 16 and the heatsink 20 are fixed in accordance with any one of the following methods. Next, to a surface on which the chip 12 of the heatsink 20 is die-bonded, namely, to a virtually central part of the heatsink 20 in the island penetrating hole 16c, the Ag paste 24 is applied. And then, the chip 12 is disposed directly above the part on which the Ag paste 24 is applied, and the chip 12 is die-bonded.

In this state, the chip pads 12a formed on the chip 12 are wire-bonded to the island 16a or the leads 16b respectively by the GND wires 18a and the lead wires 18b.

Afterwards, the circumference of the chip 12 is sealed by the sealing member 22 made of a material such as resin so as to complete the arrangement shown in FIGS. 1(a) through 2(b) (here, in FIGS. 1(a) through 2(b), the sealing member 22 is shown by a phantom line. Moreover, the leads are formed, tie bars (parts connecting the leads 16b) of the lead frame 16 are removed, and other steps are completed so as to form the independent leads 16b. At this time, the hanger pins 16d are cut so as to separate the island 16a from the leads 16b.

Here, the semiconductor device of the present embodiment is examined in view of a heat-releasing property and a high-frequency property.

Figure 1:
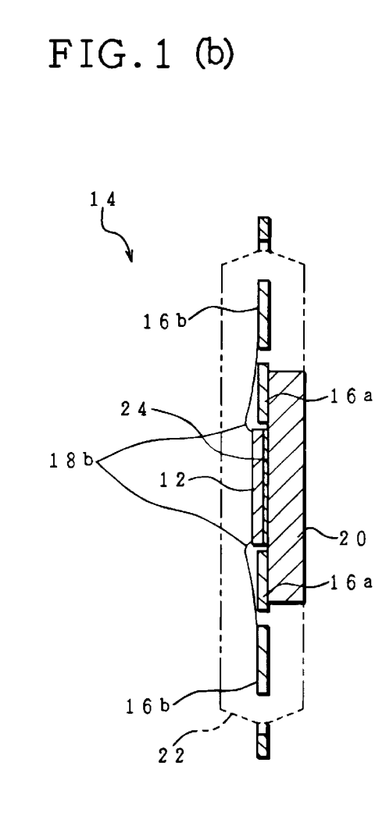
FIG. 1(a) is a plan view showing a forming process of a semiconductor device in accordance with one embodiment of the present invention.
FIG. 1(b) is a sectional view taken along line 1b—1b shown in FIG. 1(a).
Figure 2:
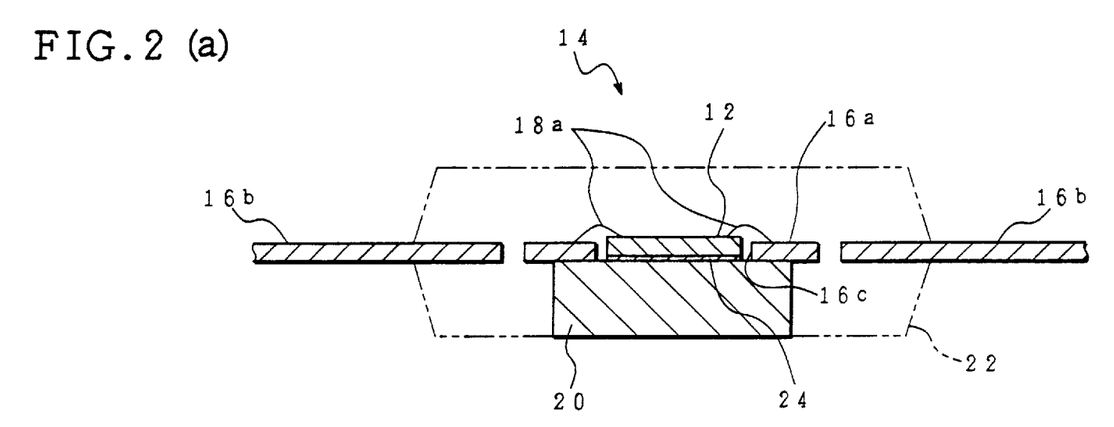
FIG. 2(a) is a sectional view taken along line 2a—2a shown in FIG. 1(a).
FIG. 2(b) is a sectional view taken along line 2b—2b shown in FIG. 1(a).
Figure 3:
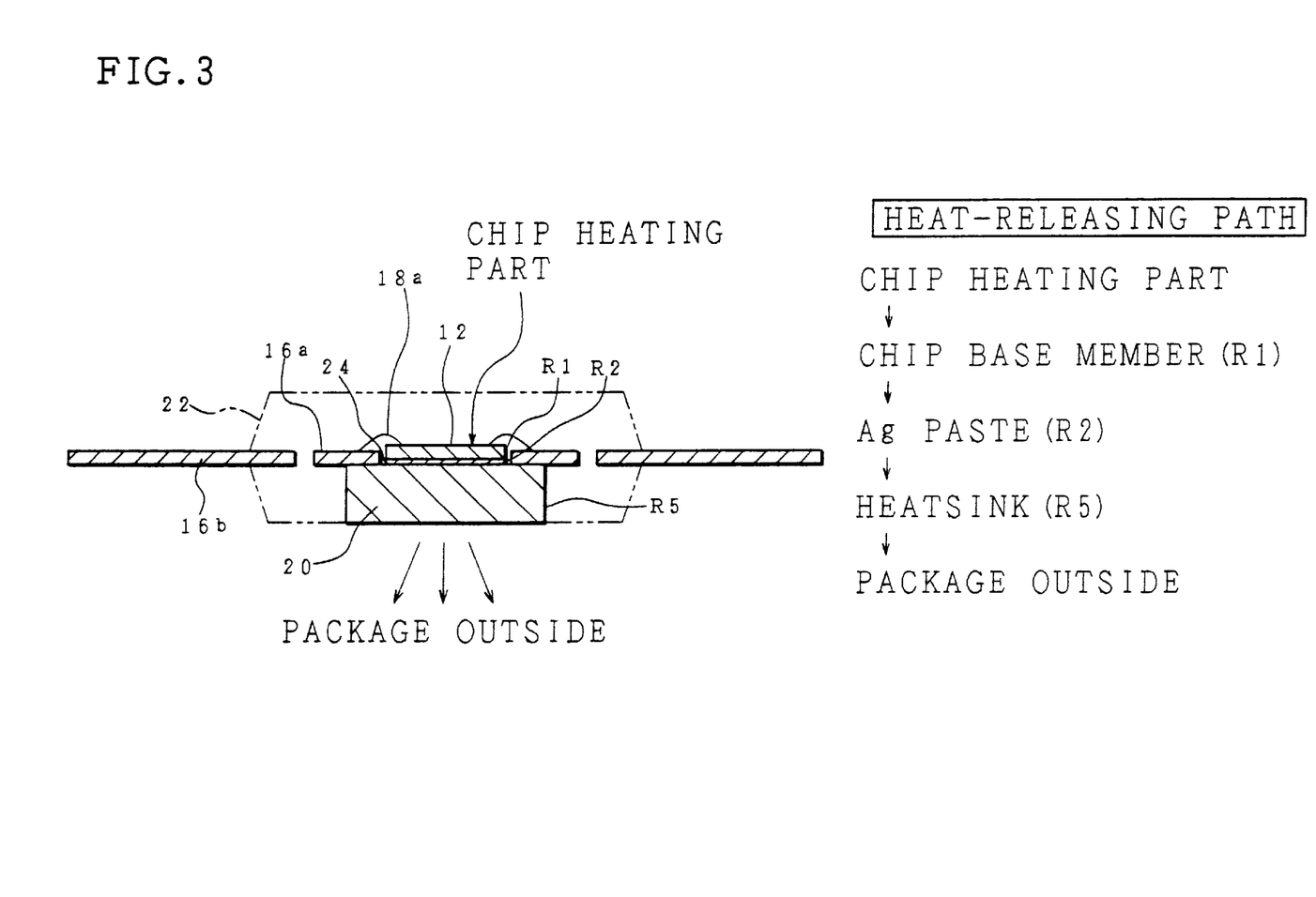
FIG. 3 is a conceptual drawing showing a heat-releasing path of the semiconductor device of FIGS. 1(a) and 1(b).

Firstly, referring to FIGS. 3 and 10, the heat-releasing property is compared with that of the conventional art. FIG. 3 is a conceptual drawing showing a heat-releasing path of the semiconductor device of the present embodiment. Further, FIG. 10 is a conceptual drawing showing a comparative example 1, in which a heat-releasing path of a semiconductor device described in a conventional art. Additionally, comparative example 1 corresponds to conventional example 1 of the conventional art.

According to the present embodiment, the heat-releasing path of the semiconductor device is shown for each heat resistance as follows: a chip 12 heating part→a chip 12 base member (R1)→the Ag paste 24 (R2)→the heat sink 20 (R5)→outside of a package 14. Thus, the path is cumulatively expressed by: package heat resistance Rth=R1+R2+R5.

Meanwhile, in comparative example 1, an island (die pad) of a lead frame (R3) and a conductive paste (R4) between the island and the heatsink additionally intervene as a heat resistance. Namely, package heat resistance Rth=R1+R2+R3+R4+R5.

As described above, as compared with the semiconductor device of comparative example 1, the semiconductor device of the present embodiment reduces heat resistances of R3 and R4 so as to lower a package heat resistance. Regarding these devices, when a package heat resistance is measured in a package evaluation after assembling, it is found that comparative example 1 has a package heat resistance of about 50° C./W and the present embodiment has a package heat resistance of about 40° C./W; consequently, about 20% improvement is actually confirmed.

Figure 4:
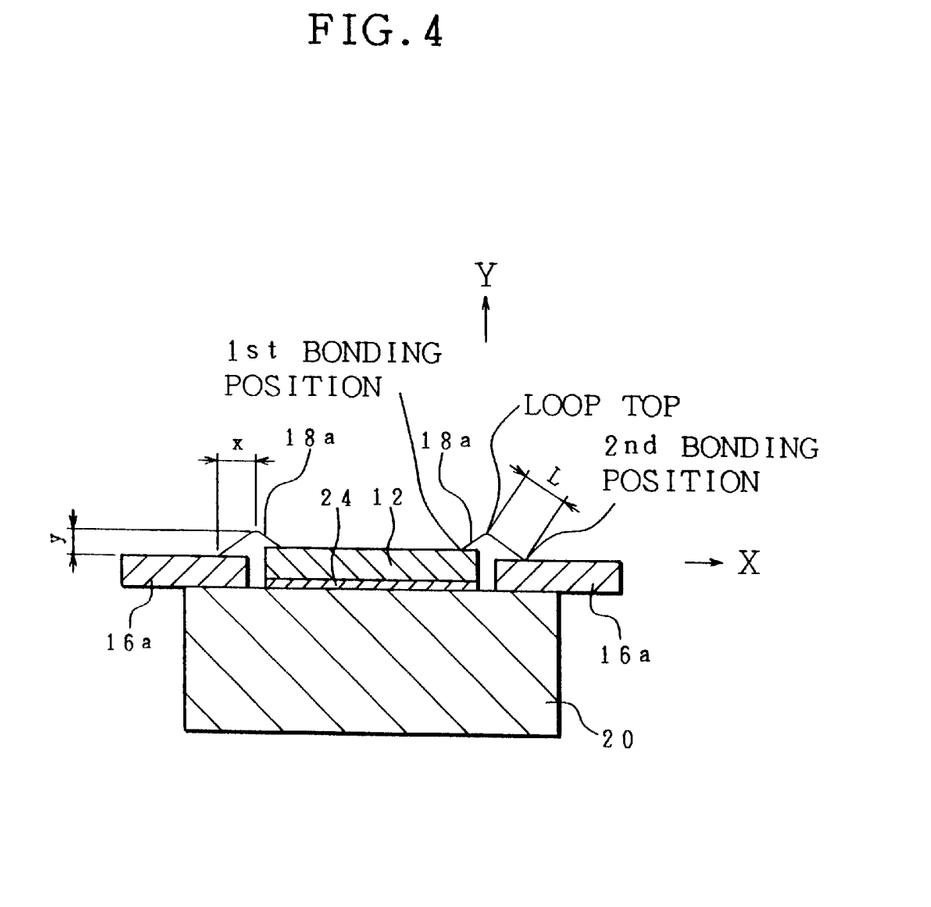
FIG. 4 is a conceptual drawing showing an area surrounding GND wires of the semiconductor device shown in FIGS. 1(a) and 1(b).
Figure 5:
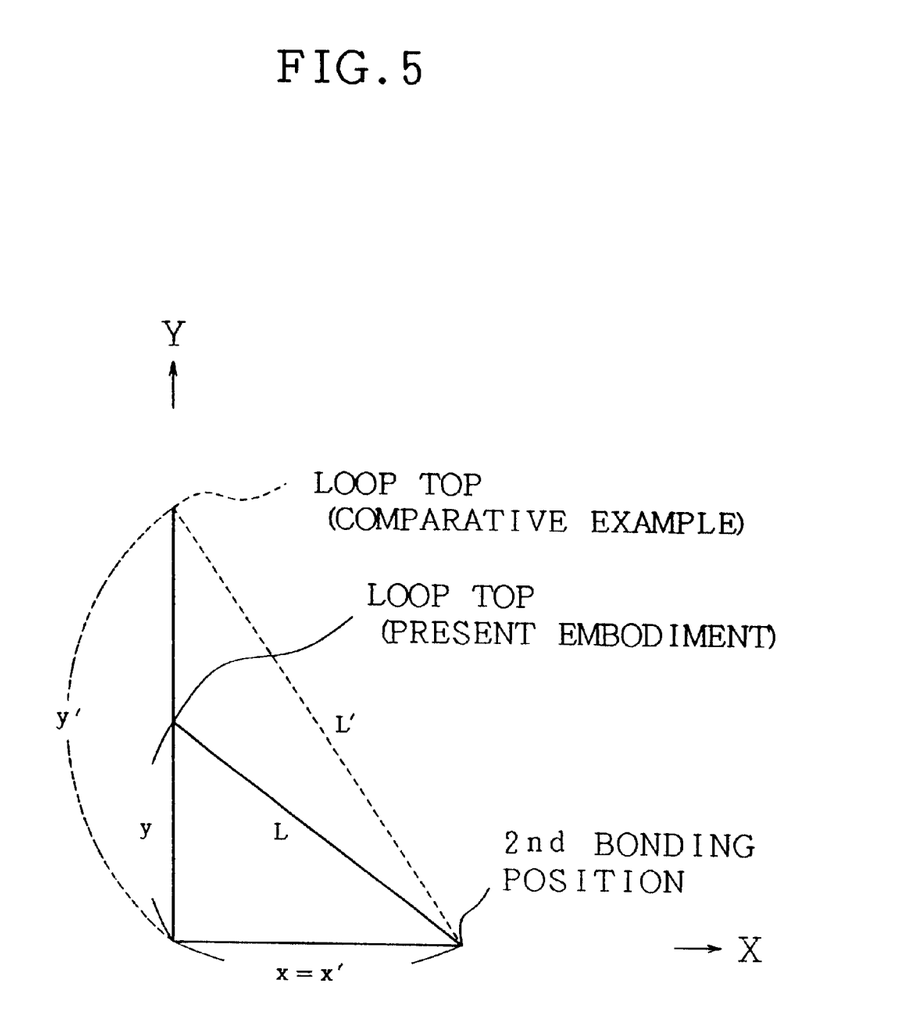
FIG. 5 is a schematic drawing for comparing GND wire lengths of semiconductor devices shown in one embodiment and a comparative example of the present invention.
Figure 11:
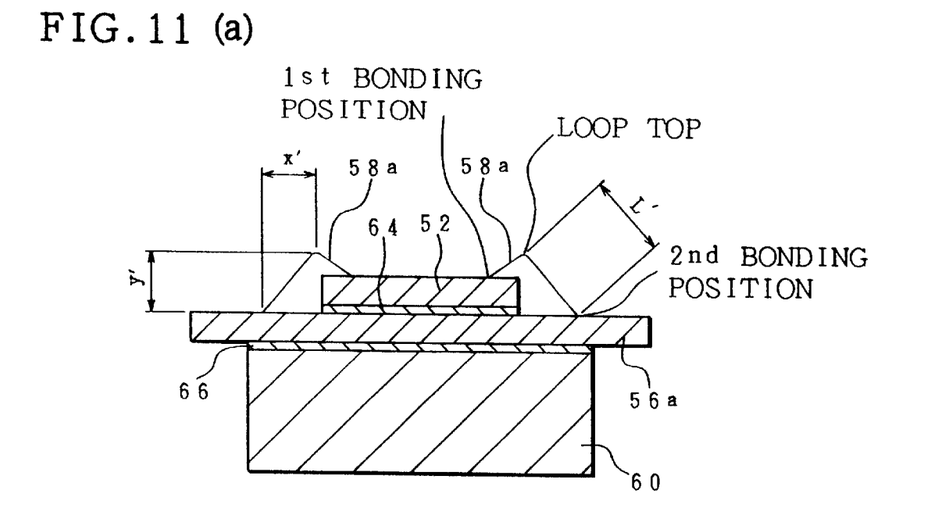
FIG. 11(a) is a schematic drawing showing an area surrounding the GND wires of the conventional semiconductor device.
FIG. 11(b) is a schematic drawing showing an area surrounding the GND wires of another conventional semiconductor device as another comparative example.

Next, referring to FIGS. 4, 5, 11(a), and 11(b), the present embodiment is compared with the conventional art regarding a high-frequency property. FIG. 4 is a schematic drawing showing an area surrounding the GND wires 18a of the semiconductor device described in the present embodiment. Moreover, FIGS. 11(a) and 11(b) are schematic drawings showing an area surrounding the GND wires 58a of the semiconductor device described in the conventional art as a comparative example. FIG. 5 is a diagram for comparing GND wire lengths of the present embodiment and the comparative example. Additionally, comparative example 1 of FIG. 11(a) and comparative example 2 of FIG. 11(b) respectively correspond to conventional example 1 and conventional example 2 of the conventional art.

Additionally, a GND inductance is considerably effected by a length of the GND wire 58a. The longer the GND wires 58a are, the larger the GND inductance tends to be. Therefore, the GND wires 58a are shortened so as to effectively reduce a GND inductance.

In the present embodiment, the chip 12 is mounted into the island penetrating hole 16c. Therefore, as compared with the conventional art, a height difference is smaller between the surfaces on which both ends of the GND wire 18a are respectively bonded. With this arrangement, even when a rising distance from the chip 12 to the highest point of the GND wire 18a is the same as that of the conventional art and a distance from the chip 12 to a bonding position on the island 16a is the same as that of the conventional art, the length of the GND wire 18a is shorter than that of the conventional art. The following explanation discusses this point.

As shown in FIG. 4, a direction in parallel with the upper surface of the chip 12 is an X direction, and a direction perpendicular to the upper surface of the chip 12 is a Y direction. Further, a bonding position of the GND wire 18a on the island 16a is a 2nd bonding position, and a highest position of the GND wire 18a is a loop top. Distances between the 2nd bonding position and the loop top in an X direction and in a y direction are respectively distances x and y. A wire length between the 2nd bonding position and the loop top of the GND wire 18a is a length L.

In comparative examples 1 and 2 as well, x', y', and L' are determined in the same manner as shown in FIGS. 11(a) and 11(b). Here, in comparative examples 1 and 2, the shapes of the GND wires 58a can be identical to each other, so that these are regarded as the same shapes in the following explanation.

In this case, x=x' is determined, and regarding a rising distance from a 1st bonding position (bonding position on the chip 12 or the chip 52) to the loop top, the GND wires 18a and 58a have the same distances. Moreover, with reference to the 2nd bonding position, the GND wires 18a and 58a are virtually brought into straight lines, and the present embodiment is compared with the comparative examples referring to FIG. 5.

As shown in FIG. 5, relationships of $L=(y^2+x^2)^{1/2}$ and $L'=(y'^2+x'^2)^{1/2}$ are established. Here, x=x'=0.20 mm and y'=0.30 mm are set. Furthermore, as described above, when the island 16a has a thickness of 0.15 mm, y=y'−0.15=0.15 mm is established. Moreover, according to these conditions, L=0.25 mm and L'=0.36 mm are set. Therefore, in the present embodiment, it is possible to shorten a GND wire length by about 30.5% as compared with the comparative examples.

In the present embodiment, it is assumed that there are five GND wires 18a (see FIG. 1(a)), so that each GND wire 18a can achieve the above-mentioned effect of shortening a length. A GND inductance on a high-frequency circuit is not simply reduced in a proportional manner relative to a GND wire length. When a high-frequency property is actually evaluated regarding the comparative examples and the present embodiment, in the present embodiment, the GND inductance is smaller by about 15% than those of the comparative examples. Therefore, the effect of reducing a GND inductance is confirmed.

As described above, when a distance remains the same between the 1st bonding position and the loop top, a length of the GND wire 18a is shorter as the upper surface of the chip 12 is closer to the upper surface of the island 16a, thereby increasing the effect of reducing the GND inductance.

Here, regarding thicknesses of the chip 12 and the island 16a, when the chip 12 has a thickness of $t_0$ and the island 16a has a thickness of $t_1$, it is preferable to satisfy $0<t_1 \leq (t_0/2)$.

When a GaAsMMIC chip is used as the chip 12, or in other cases, an air bridge is formed on the surface of the chip 12 in many cases. At this time, as a collet used for die-bonding the chip 12, a pyramid collet is used.

In the case of using the pyramid collet, it is necessary to secure a part having about a half of a thickness of the chip 12 (about $t_0/2$) as a holding part for the pyramid collet. Therefore, when a thickness of the island 16a is larger than a half of a thickness of the chip 12, the island penetrating hole 16c needs to be large such that the pyramid collet is not contact with the island 16a, so that it becomes difficult to sufficiently shorten the GND wires 18a.

Therefore, it is desirable to set a thickness of the island 16a at a half or less of a thickness of the chip 12. In this case, even when the pyramid collet is used for die-bonding the chip 12, it is possible to sufficiently shorten the GND wires 18a.

However, even when the above-mentioned relationship is not satisfied, a concave part is disposed at a part of the heatsink 20, that is die-bonded to the chip 12, so as to achieve the same effect.

The above-mentioned lead frame 16, which is used for the semiconductor device of the present embodiment, is characterized as follows:

Namely, a lead frame having a heatsink for a high-frequency device and others is formed by integrating the lead frame 16 including the island 16a, and the separately formed heatsink 20. Further, the lead frame having the heatsink includes the island penetrating hole 16c in the island 16a so as to mount the chip 12 into the island penetrating hole 16c upon manufacturing the semiconductor device. Hence, it is possible to shorten wire lengths of the GND wires 18a, so that a GND inductance can be reduced.

Although the island 16a is provided on the lead frame having the heat sink, the chip 12 can be directly mounted on the heatsink 20 so as to minimize a heat-transmitting path.

Namely, the separately formed heatsink 20 and lead frame 16 are combined with each other so as to directly dispose the chip 12 on the heatsink 20 in the island penetrating hole 16c. The lead frame 16 includes the island penetrating hole 16c being slightly larger than the chip 12 on the island 16a. This arrangement makes it possible to shorten wire lengths of the GND wires 18a and to minimize a heating path.

As described above, the lead frame 16 of the present embodiment makes it possible to improve a heat-releasing property and a high-frequency property and to efficiently exert capability of the mounted chip 12, without the necessity for an insulating paste causing deterioration in reliability and productivity of the semiconductor device and increase in cost, while preventing increase in a size of the chip 12.

Namely, the lead frame 16 of the present embodiment makes it possible to manufacture a semiconductor device with high reliability and a favorable heat-releasing property, while reducing deterioration in a yield and an increase in the cost, that are caused by bonding and wire-bonding defects of the heatsink 20.

Furthermore, the lead frame 16 of the present embodiment makes it possible to reduce a GND inductance while preventing an increase in the number of wires for grounding and a size of the chip 12, and while preventing an increase in cost, that is caused by a larger size of the chip 12 and a larger number of assembling materials.

Consequently, it is possible to provide the lead frame 16 which can prevent an increase in cost and can efficiently exert the capability of the chip 12 mounted thereon.

As described above, in the semiconductor device of the present embodiment, the chip 12 is directly disposed on the heatsink 20 so as to efficiently release heat generated in the chip 12. Therefore, even in the case of a continuous operation, it is possible to prevent an increase in temperature in the semiconductor device and to prevent deterioration in a property such as saturation and a reduction in an output value, that is caused by a higher temperature; consequently, a design value of the mounted chip 12 can be efficiently obtained. Additionally, the semiconductor device makes it possible to reduce deterioration in a property of the semiconductor device, that is caused by a GND inductance, so as to efficiently exert a property of the semiconductor chip mounted thereon.

Here, in the present embodiment, the above explanation describes a construction in which the island penetrating hole 16c is formed in the island 16a. However, the present embodiment is not limited to this arrangement. Any construction is acceptable if the island 16a is positioned on a circumference of the chip 12. For example, the island 16a can be divided into parts as long as the island 16a is positioned around the chip 12.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A lead frame for a semiconductor device comprising:
   an island for receiving a semiconductor chip,
   a metallic block disposed on said island, and
   a lead extended to said island,
   wherein a penetrating hole is defined in said island, said penetrating hole having transverse dimensions larger than the semiconductor chip for receiving the semiconductor chip therein, and said metallic block is disposed so as to cover said penetrating hole.

2. The lead frame as defined in claim 1, wherein said island and said metallic block are formed so as to be separated from said lead.

3. The lead frame as defined in claim 1, wherein said metallic block is mounted on said island by spot welding.

4. The lead frame as defined in claim 1, wherein said metallic block is mounted on said island via a conductive paste.

5. The lead frame as defined in claim 1, wherein said metallic block is mounted on said island via a metallically preformed eutectic.

6. A semiconductor device comprising:
   said lead frame defined in claim 1, and
   a semiconductor chip being mounted on said metallic block in said penetrating hole formed in the lead frame.

7. The semiconductor device as defined in claim 6, wherein said semiconductor chip is mounted on said metallic block via an Ag paste.

8. The semiconductor device as defined in claim 6, further comprising a sealing member for covering said semiconductor chip and a surface of said metallic block that has said semiconductor chip mounted thereon, wherein a back of the surface of said metallic block is exposed from said sealing member, said surface having said semiconductor chip mounted thereon.

9. The semiconductor device as defined in claim 6, wherein when said semiconductor chip has a thickness of $t_0$ and said island has a thickness of $t_1$, a relationship of $0 < t_1 \leq (t_0/2)$ is satisfied.

10. A semiconductor device comprising:
    said lead frame defined in claim 2, and
    a semiconductor chip having a ground terminal that is mounted on said metallic block in said penetrating hole formed in the lead frame,
    wherein the ground terminal of said semiconductor chip is connected to a GND wire, which is connected to said island of said lead frame.

11. A semiconductor device comprising:
    a semiconductor chip having a ground terminal that is mounted on a surface of a heatsink, and
    a metallic member disposed on the surface of said heatsink that has said semiconductor chip mounted thereon,
    wherein said ground terminal and said metallic member are wire-bonded to each other.

12. The semiconductor device as defined in claim 11, wherein said heatsink and said metallic member are electrically brought into conduction to each other.

13. A lead frame for a semiconductor device comprising:
    a lead serving as a terminal of the semiconductor device upon forming the semiconductor device,
    an island separated from said lead upon forming the semiconductor device, and
    a supporting part which integrates said lead and said island and is divided upon forming the semiconductor device,
    wherein a penetrating hole is defined in said island in which a semiconductor chip is disposed, and a heatsink is mounted on said island so as to have said semiconductor chip disposed thereon.

14. A semiconductor device comprising:

a semiconductor chip including a ground terminal, a heatsink including a surface for mounting the semiconductor chip, a metallic member mounted on the surface so as to be electrically conducting to the surface with a thickness of a half or less that of said semiconductor chip, and a bonding wire for connecting said metallic member and the ground terminal of said semiconductor chip.

15. A semiconductor device, comprising:

a lead frame having (a) an island, and (b) leads extended to the island and divided from the island, said island having first and second surfaces;

a heatsink having a planar surface fixed to said second surface of the island of the lead frame so as to provide conductivity between the island and the heatsink;

a semiconductor chip, said semiconductor chip having first and second surfaces, a ground terminal being provided on said first surface of said semiconductor chip, and said second surface of said semiconductor chip being die-bonded to said planar surface of the heat sink; and a ground wire wiring-bonding said ground terminal and the first surface of the island, wherein the island has a penetrating hole having transverse dimensions larger than the semiconductor chip for receiving the semiconductor chip therein, wherein the semiconductor chip is received into the penetrating hole of the island, and wherein a height difference between surfaces wire-bonded by the ground wire is reduced as compared to a construction in which the ground wire wire-bonds the ground terminal and the planar surface of the heatsink.

16. The semiconductor device as defined in claim 15, wherein the heatsink is fixed to the island by welding.

17. The semiconductor device as defined in claim 15, wherein the heatsink is fixed to the island with conductive paste.

18. The semiconductor device as defined in claim 15, wherein the heatsink is fixed to the island with a metal preform eutectic crystal.

19. The semiconductor device as defined in claim 15, wherein the semiconductor chip is die-bonded with silver paste.

20. The semiconductor device as defined in claim 15, further comprising a sealing member for covering said semiconductor chip and the planar surface of the heatsink so that a reverse side of the planar surface is not covered with the sealing member.

21. The semiconductor device as defined in claim 15, wherein the semiconductor chip and the island satisfy the following equation: $0 < t_1 \leq (t_0/2)$, where $t_0$ is a thickness of the semiconductor chip, and $t_1$ is the thickness of the island.

* * * * *